(12) United States Patent
Li

(10) Patent No.: US 10,818,704 B2
(45) Date of Patent: Oct. 27, 2020

(54) METHOD FOR MANUFACTURING THIN FILM TRANSISTOR, AND THIN FILM TRANSISTOR, INCLUDING FORMING AN ORGANIC LIGHT-EMITTING DEVICE

(71) Applicant: WUHAN CHINA STAR OPTOELECTRONICS TECHNOLOGY CO., LTD., Wuhan, Hubei (CN)

(72) Inventor: Songshan Li, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 342 days.

(21) Appl. No.: 15/565,498

(22) PCT Filed: Aug. 3, 2017

(86) PCT No.: PCT/CN2017/095744
§ 371 (c)(1),
(2) Date: Oct. 10, 2017

(87) PCT Pub. No.: WO2019/010737
PCT Pub. Date: Jan. 17, 2019

(65) Prior Publication Data
US 2019/0386030 A1 Dec. 19, 2019

(30) Foreign Application Priority Data

Jul. 12, 2017 (CN) .......................... 2017 1 0565553

(51) Int. Cl.
*H01L 27/12* (2006.01)
*H01L 29/786* (2006.01)
(Continued)

(52) U.S. Cl.
CPC ........ *H01L 27/127* (2013.01); *H01L 27/1248* (2013.01); *H01L 27/1262* (2013.01);
(Continued)

(58) Field of Classification Search
CPC ............... H01L 27/127; H01L 27/1262; H01L 27/1248; H01L 51/56; H01L 51/5237;
(Continued)

(56) References Cited

U.S. PATENT DOCUMENTS 7,294,924 B2 * 11/2007 Kim .................. H01L 29/41733
257/706
7,696,689 B2 * 4/2010 Lee ..................... H01L 27/3246
313/504
(Continued)

FOREIGN PATENT DOCUMENTS

CN    102637631 A    8/2012
CN    104091894 A    10/2014
(Continued)

*Primary Examiner* — Khiem D Nguyen

(57) ABSTRACT

Disclosed is a method for manufacturing a thin film transistor, and a thin film transistor, relating to the technical field of liquid crystal display. The method comprises steps of: forming a buffer layer, an active layer, a gate insulator layer, and a gate electrode layer successively on a glass substrate and patterning these layers; forming an inter-layer dielectric layer on the buffer layer, the active layer, and the gate electrode layer and patterning the inter-layer dielectric layer; forming a source and a drain on the inter-layer dielectric layer, enabling the source and the drain to come into contact with the active layer, and patterning the source and the drain; forming a passivation layer and an organic photoresist layer successively on the inter-layer dielectric layer, the source, and the drain, and patterning the organic photoresist layer; dry-etching the passivation layer by using the organic photoresist layer as a mask, so as to form a hole on the passivation layer; and forming an organic light-emitting
(Continued)

device by means of the hole on the passivation layer. The method saves a mask, requires simple techniques, and saves manufacturing costs. Besides, the developer is not able to come into direct contact with exposed aluminum of the source and the drain resulted from etching of the passivation layer. The method thus achieves the aim of improving product characteristics.

8 Claims, 2 Drawing Sheets

(51) Int. Cl.
*H01L 51/52* (2006.01)
*H01L 51/56* (2006.01)
*G02F 1/13357* (2006.01)

(52) U.S. Cl.
CPC .... *H01L 29/7869* (2013.01); *H01L 29/78618* (2013.01); *H01L 51/5206* (2013.01); *H01L 51/5237* (2013.01); *H01L 51/56* (2013.01); *G02F 1/133603* (2013.01)

(58) Field of Classification Search
CPC ............ H01L 51/0097; H01L 27/3258; H01L 27/1214; H01L 27/3244; H01L 51/5206; H01L 27/1288; H01L 51/50; H01L 51/52; H01L 51/0032–0095; H01L 27/32; H01L 27/3202; H01L 27/3204; H01L 27/3209; H01L 2251/50; H01L 2251/5338; H01L 2251/5353; B32B 2457/206
See application file for complete search history.

(56) References Cited

U.S. PATENT DOCUMENTS

| | | | |
|---|---|---|---|
| 2008/0218058 A1* | 9/2008 | Son | H01L 51/5218 313/500 |
| 2010/0020258 A1* | 1/2010 | Chang | G02F 1/13394 349/46 |
| 2011/0129968 A1* | 6/2011 | Park | H01L 29/41733 438/166 |
| 2011/0210661 A1* | 9/2011 | Nishi | H01L 27/3244 313/498 |
| 2011/0297951 A1* | 12/2011 | Shin | H01L 27/1288 257/71 |
| 2013/0334502 A1* | 12/2013 | Liu | H01L 27/3265 257/40 |
| 2014/0159033 A1* | 6/2014 | Jeong | H01L 29/66969 257/43 |
| 2014/0220715 A1* | 8/2014 | Kang | C23C 14/042 438/26 |
| 2014/0346445 A1* | 11/2014 | Cho | H01L 51/5246 257/40 |
| 2015/0207094 A1* | 7/2015 | Hwang | H01L 51/5203 257/88 |
| 2016/0240599 A1* | 8/2016 | Li | H01L 21/77 |
| 2016/0343784 A1* | 11/2016 | Shi | H01L 51/56 |
| 2017/0294464 A1* | 10/2017 | Kwon | G02F 1/13624 |

FOREIGN PATENT DOCUMENTS

| CN | 104538421 A | 4/2015 |
|---|---|---|
| CN | 106229347 A | 12/2016 |

* cited by examiner

US 10,818,704 B2

METHOD FOR MANUFACTURING THIN FILM TRANSISTOR, AND THIN FILM TRANSISTOR, INCLUDING FORMING AN ORGANIC LIGHT-EMITTING DEVICE

CROSS-REFERENCE TO RELATED APPLICATIONS

The present application claims the priority of Chinese patent application CN 201710565553.5, entitled "Method for manufacturing thin film transistor, and thin film transistor" and filed on Jul. 12, 2017, the entirety of which is incorporated herein by reference.

FIELD OF THE INVENTION

The present disclosure relates to the technical field of liquid crystal display, and in particular, to a method for manufacturing a thin film transistor, and a thin film transistor.

BACKGROUND OF THE INVENTION

Thanks to characteristics of high electron mobility, low leakage currents, low manufacturing temperature, etc., oxide semiconductors have attracted wide attention. For a conventional top-gate self-aligned structure, after a source and a drain are formed, two procedures of mold processing are required to form a passivation layer and an organic insulation film, which demands complicated techniques and a high manufacturing cost. Due to homogeneity of film formation of the passivation layer and homogeneity of dry etching, a film at top of the source and a film at top of the drain are easy to be etched and aluminium in the source and the drain is then exposed. In a yellow photo process of the organic insulation film, TMAH, an alkaline developer, corrodes the aluminium, resulting in poor surface contact between an indium tin oxide (ITO) anode and the source and the drain, and thus affecting product characteristics.

SUMMARY OF THE INVENTION

In order to solve the above problem, the present disclosure provides a method for manufacturing a thin film transistor, and a thin film transistor.

To achieve the above aim, the present disclosure provides a method for manufacturing a thin film transistor. The method comprises the following steps.

A buffer layer, an active layer, a gate insulator layer, and a gate electrode layer are successively formed on a substrate and are patterned.

An inter-layer dielectric layer is formed on the buffer layer, the active layer, and the gate electrode layer and is patterned.

A source and a drain are formed on the inter-layer dielectric layer. The source and the drain pass through the inter-layer dielectric layer and come into contact with the active layer. The source and the drain are patterned.

A passivation layer is formed on the inter-layer dielectric layer, the source, and the drain. An organic photoresist layer is formed on the passivation layer. The organic photoresist layer is patterned.

The passivation layer is dry-etched by using the organic photoresist layer as a mask, so as to form a hole on the passivation layer.

An organic light-emitting device is formed by means of the hole on the passivation layer.

In the above method for manufacturing a thin film transistor, the buffer layer, the active layer, the gate insulator layer, and the gate electrode layer are patterned by photolithographic technology.

In the above method for manufacturing a thin film transistor, areas where the source and the drain come into contact with the active layer are enabled to be conductive by plasma treatment.

In the above method for manufacturing a thin film transistor, the plasma is ionized nitrogen gas, or argon gas, or helium gas, or ammonia gas.

In the above method for manufacturing a thin film transistor, the passivation layer is formed by plasma enhanced chemical vapor deposition (PECVD).

In the above method for manufacturing a thin film transistor, the step of forming an organic light-emitting device by means of the hole on the passivation layer, further comprises the following steps.

An ITO electrode is formed on the organic photoresist layer. The ITO electrode passes through the hole on the passivation layer and comes into contact with the source and the drain. The ITO electrode is patterned.

A pixel defining layer is formed on the organic photoresist layer and the ITO electrode and is then patterned.

An organic light-emitting material is evaporated onto the ITO electrode, so as to form an organic light-emitting device.

In the above method for manufacturing a thin film transistor, the passivation layer is made of a nano-scale silicon oxide.

In the above method for manufacturing a thin film transistor, the source and the drain are made of molybdenum or aluminium.

In the above method for manufacturing a thin film transistor, the inter-layer dielectric layer is made of a nano-scale silicon oxide.

A thin film transistor manufactured according to the above method, comprises: a substrate, on which a buffer layer, an active layer, a gate insulator layer, and a gate electrode layer are successively formed; an inter-layer dielectric layer, formed on the buffer layer, the active layer, and the gate electrode layer; a source and a drain, formed on the inter-layer dielectric layer and passing through the inter-layer dielectric layer to come into contact with the active layer; a passivation layer, formed on the inter-layer dielectric layer, the source, and the drain; an organic photoresist layer, formed on the passivation layer; an ITO electrode, formed on the organic photoresist layer and passing through the hole on the passivation layer to come into contact with the source or the drain; a pixel defining layer, formed on the organic photoresist layer and the ITO electrode; and an organic light-emitting device, formed in the pixel defining layer and passing through the pixel defining layer to come into contact with the ITO electrode.

In the method for manufacturing a thin film transistor provided in the present disclosure, after a source and a drain are formed in a top-gate self-aligned structure, a passivation layer is formed by PECVD but is not patterned. Then an organic photoresist layer is formed and patterned. After the patterning and annealing of the organic photoresist layer, the passivation layer is dry-etched by using the organic photoresist layer as a mask and the power is adjusted to an appropriate level, so as to form a hole on the passivation layer. By way of this, the method saves a mask, requires simple techniques, and saves manufacturing costs. Besides, the developer is not able to come into direct contact with exposed aluminum of the source and the drain resulted from etching of the passivation layer. Thus, the method can achieve the aim of improving product characteristics.

Since the above method for manufacturing a thin film transistor achieves the above technical effects, the thin film transistor manufactured according to this method shall also achieve corresponding technical effects.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

Figure 1:
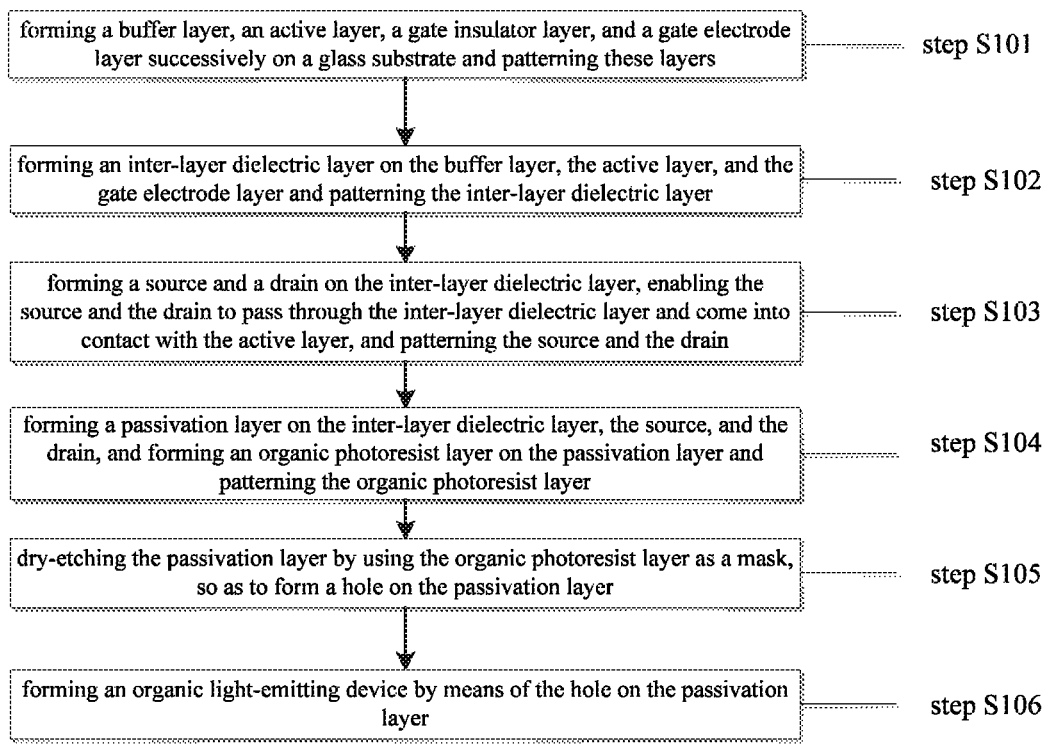
FIG. 1 shows a flow diagram of a method for manufacturing a thin film transistor in one embodiment of the present disclosure.

In the drawings, the same components are represented by the same reference signs, and the size of each component does not represent the actual size of the corresponding component.

DETAILED DESCRIPTION OF THE EMBODIMENTS

The details of the present disclosure can be understood more clearly combining the description on the drawings and the embodiments. However, the specific embodiments disclosed herein are only used for illustrating the present disclosure, while cannot be understood as limiting the present disclosure in any manner. Those skilled in the art can make any deformations under the teaching of the technical content disclosed herein, and all the deformations fall into the scope of the present disclosure. The present disclosure will be further illustrated hereinafter with reference to the drawings.

The present disclosure will be described in detail hereinafter with reference to the accompanying drawings. The terms "upper", "lower", "right", and "left" in the following text are directions relative to the directions shown in the drawings, and should not be construed as limiting the scope of the disclosure.

The present disclosure will be illustrated further with reference to the drawings.

FIG. 1 schematically shows a method for manufacturing a thin film transistor. The method comprises the following steps.

In step S101, a buffer layer 2, an active layer 3 (IGZO), a gate insulator layer 4, and a gate electrode layer 5 are successively formed on a glass substrate 1 and are patterned.

In step S102, an inter-layer dielectric layer 6 is formed on the buffer layer 2, the active layer 3, and the gate electrode layer 5 and is then patterned.

In step S103, a source 12 and a drain 13 are formed on the inter-layer dielectric layer 6. The source 12 and the drain 13 pass through the inter-layer dielectric layer 6 and come into contact with the active layer 3. The source 12 and the drain 13 are then patterned.

In step S104, a passivation layer 7 and an organic photoresist layer 8 are successively formed on the inter-layer dielectric layer 6, the source 12, and the drain 13. The organic photoresist layer 8 is then patterned. After the patterning, the organic photoresist layer 8 is annealed.

In step S105, the passivation layer 7 is dry-etched by using the organic photoresist layer 8 as a mask, so as to form a hole on the passivation layer 7. The hole is connected with the source 12 or the drain 13.

In step S106, an organic light-emitting device 10 is formed by means of the hole on the passivation layer 7.

After the source 12 and the drain 13 are formed in a top-gate self-aligned structure, the passivation layer 7 is deposited but is not patterned. Then the organic photoresist layer 8 is formed and patterned. After the patterning and annealing of the organic photoresist layer 8, the passivation layer 7 is dry-etched by using the organic photoresist layer 8 as a mask and the power is adjusted to an appropriate level, so as to form the hole on the passivation layer 7. By way of this, the method saves a mask, requires simple techniques, and saves manufacturing costs. Besides, a developer is not able to come into direct contact with exposed aluminum of the source 12 or the drain 13 resulted from etching of the passivation layer 7. Thus, the method can achieve the aim of improving product characteristics.

In one embodiment, in step S101, the buffer layer 2, the active layer 3, the gate insulator layer 4, and the gate electrode layer 5 are patterned by photolithographic technology.

In one embodiment, in step S103, areas where the source 12 and the drain 13 come into contact with the active layer 3 are enabled to be conductive by plasma treatment.

In one embodiment, the plasma is ionized nitrogen gas, or argon gas, or helium gas, or ammonia gas.

In one embodiment, in step S104, the passivation layer 7 is formed by plasma enhanced chemical vapor deposition (PECVD).

In one embodiment, step S106 further comprises the following steps.

In step S1061, an ITO electrode 9 is formed on the organic photoresist layer 8. The ITO electrode 9 passes through the hole on the passivation layer 7 and comes into contact with the source 12 or the drain 13. The ITO electrode 9 is then patterned.

In step S1062, a pixel defining layer 11 is formed on the organic photoresist layer 8 and the ITO electrode 9 and is then patterned.

In step S1063, an organic light-emitting material is evaporated onto the ITO electrode 9, so as to form an organic light-emitting device 10.

In one embodiment, the passivation layer 7 is made of a nano-scale silicon oxide (SiOx).

In one embodiment, the source 12 and the drain 13 are made of molybdenum or aluminium (Mo/Al).

In one embodiment, the inter-layer dielectric layer 6 is made of a nano-scale silicon oxide (SiOx).

Figure 2:
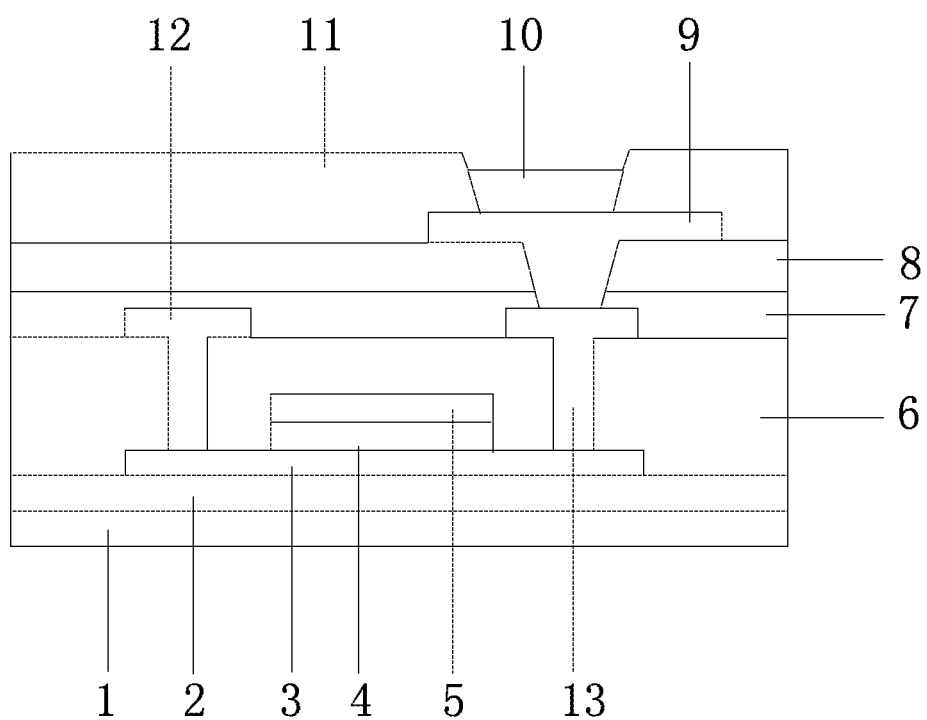
FIG. 2 schematically shows a thin film transistor in one embodiment of the present disclosure.

In one embodiment, as shown in FIG. 2, a thin film transistor, comprises: a glass substrate 1, on which a buffer layer 2, an active layer 3, a gate insulator layer 4, and a gate electrode layer 5 are successively formed; an inter-layer dielectric layer 6, formed on the buffer layer 2, the active layer 3, and the gate electrode layer 5; a source 12 and a drain 13, formed on the inter-layer dielectric layer 6 and passing through the inter-layer dielectric layer 6 to come into contact with the active layer 3; a passivation layer 7, formed on the inter-layer dielectric layer 6, the source 12, and the drain 13; an organic photoresist layer 8, formed on the passivation layer; an ITO electrode 9, formed on the organic photoresist layer 8 and passing through the hole on the passivation layer 7 to come into contact with the source 12 or the drain 13; a pixel defining layer 11, formed on the organic photoresist layer 8 and the ITO electrode 9; and an organic light-emitting device 10, formed in the pixel defining layer 11 and passing through the pixel defining layer 11 to come into contact with the ITO electrode 9.

At last, it should be noted that, the above embodiments are only used for illustrating, rather than restricting the present disclosure. The present disclosure is illustrated in detail in combination with preferred embodiments hereinabove, but it can be understood that, the embodiments disclosed herein can be amended or substituted without departing from the protection scope of the present disclosure. In particular, as long as there are no structural conflicts, the technical features disclosed in each and every embodiment of the present disclosure can be combined with one another in any way, and the combined features formed thereby are within the protection scope of the present disclosure. As long as changes or substitutes do not depart from the spirit and scope of the technical solutions in the present disclosure, they shall all fall into the protection scope of the claims of the present disclosure.

The invention claimed is:

1. A method for manufacturing a thin film transistor, comprising the following steps:
   step S101, forming a buffer layer, an active layer, a gate insulator layer, and a gate electrode layer successively on a substrate, and patterning the buffer layer, the active layer, the gate insulator layer, and the gate electrode layer;
   step S102, forming an inter-layer dielectric layer on the buffer layer, the active layer, and the gate electrode layer, and patterning the inter-layer dielectric layer;
   step S103, forming a source and a drain on the inter-layer dielectric layer, enabling the source and the drain to pass through the inter-layer dielectric layer and come into contact with the active layer, and patterning the source and the drain;
   step S104, forming a passivation layer on the inter-layer dielectric layer, the source, and the drain, and forming an organic photoresist layer on the passivation layer and patterning the organic photoresist layer;
   step S105, dry-etching the passivation layer by using the organic photoresist layer as a mask, so as to form a hole in the passivation layer; and
   step S106, forming an organic light-emitting device by means of the hole in the passivation layer,
   wherein step S106 further comprises the following steps:
   step S1061, forming an indium tin oxide electrode on the organic photoresist layer, enabling the indium tin oxide electrode to pass through the hole in the passivation layer and come into contact with the source or the drain, and patterning the indium tin oxide electrode;
   step S1062, forming a pixel defining layer on the organic photoresist layer and the indium tin oxide electrode, and patterning the pixel defining layer; and
   step S1063, evaporating an organic light-emitting material onto the indium tin oxide electrode, so as to form the organic light-emitting device.

2. The method for manufacturing a thin film transistor according to claim 1, wherein in step S101, the buffer layer, the active layer, the gate insulator layer, and the gate electrode layer are patterned by photolithographic technology.

3. The method for manufacturing a thin film transistor according to claim 1, wherein in step S103, areas where the source and the drain come into contact with the active layer are enabled to be conductive by plasma treatment.

4. The method for manufacturing a thin film transistor according to claim 3, wherein a plasma is ionized nitrogen gas, or argon gas, or helium gas, or ammonia gas.

5. The method for manufacturing a thin film transistor according to claim 1, wherein in step S104, the passivation layer is formed by plasma enhanced chemical vapor deposition.

6. The method for manufacturing a thin film transistor according to claim 1, wherein the passivation layer is made of a nano-scale silicon oxide.

7. The method for manufacturing a thin film transistor according to claim 1, wherein the source and the drain are made of molybdenum or aluminium.

8. The method for manufacturing a thin film transistor according to claim 1, wherein the inter-layer dielectric layer is made of a nano-scale silicon oxide.

* * * * *